United States Patent [19]

Petler

[11] Patent Number: 5,542,034
[45] Date of Patent: Jul. 30, 1996

[54] MINIMIZING LOGIC TO DETERMINE CURRENT STATE IN AN OUTPUT ENCODED FINITE STATE MACHINE

[75] Inventor: Scott C. Petler, Rocklin, Calif.

[73] Assignee: Hewlett-Packard Company, Palo Alto, Calif.

[21] Appl. No.: 325,916

[22] Filed: Oct. 19, 1994

[51] Int. Cl.⁶ .................................................. G06F 3/00
[52] U.S. Cl. ......................... 395/500; 364/488; 364/489
[58] Field of Search ............................... 395/500, 775, 395/287, 800; 364/488, 489, 578, 243, 244, 244.8, 231.8, 232.3, 490, 491, DIG. 1, DIG. 2, 716; 371/19, 16.5, 29.1, 27, 24; 326/40, 44, 39; 327/202; 340/825.83

[56] References Cited

U.S. PATENT DOCUMENTS

| | | | |
|---|---|---|---|
| 3,883,801 | 5/1972 | Hess | 371/27 |
| 4,488,229 | 12/1984 | Harrison | 364/DIG. 1 |
| 4,488,230 | 12/1984 | Harrison | 364/DIG. 1 |
| 4,661,922 | 4/1987 | Thierbach | 364/DIG. 2 |
| 4,694,411 | 9/1987 | Burrows | 395/500 |
| 4,862,347 | 8/1989 | Rudy | 395/500 |
| 5,041,986 | 8/1991 | Tanishita | 364/489 |
| 5,058,114 | 10/1991 | Kuboki et al. | 371/19 |
| 5,258,919 | 11/1993 | Yamanouchi et al. | 364/488 |

OTHER PUBLICATIONS

Steve Golson, *State Machine Design Techniques for Verilog and VHDL*, Synopsys Journal of High–Level Design, Sep. 1994, pp. 1–44.

*Primary Examiner*—Kevin J. Teska
*Assistant Examiner*—Jacques H. Louis-Jacques

[57] ABSTRACT

Logic to determine the current state of an output encoded finite state machine is minimized. Specifically, in order to generate logic for a finite state machine, input is received from a user. The input specifies states of the finite state machine, transition conditions between states and output values for each state. For example, a graphical user interface is used to receive a graphic portrayal of a state diagram. Logic is generated which implements the finite state machine from the inputs received by the interface means. Particularly, a plurality of flip-flops is generated. A first set of flip-flops is for storing output for the finite state machine. A second set of flip-flops is used, when necessary, with the first set of flip-flops to uniquely identify each state. When output values of the first set of flip-flops uniquely identify each state, the second set of flip-flops is not used (i.e., the second set of flip-flops is the null set). For each state, a combination of a minimum number of the flip-flops from the first set of flip-flops and the second set of flip-flops is detected which uniquely identifies the state.

10 Claims, 6 Drawing Sheets

MINIMIZING LOGIC TO DETERMINE CURRENT STATE IN AN OUTPUT ENCODED FINITE STATE MACHINE

BACKGROUND

The present invention relates generally to generation of logic for a finite state machine (FSM). More particularly, the invention concerns a method for minimizing logic to determine a current state in an output encoded finite state machine.

In many situations a finite state machine can be represented using standard building blocks, particularly, a next state decode block, state memory storage elements and an output decode block. Typically, the state memory storage elements are delay (D) flip-flops. The D flip-flops store an encoded value which indicates the current state of the finite state machine. The output decode block generates the FSM outputs based on the current state as determined from the encoded value stored by the D flip-flops. Combinatorial logic in the next state decode block and the output decode block are reduced to limit the circuitry necessary to implement the finite state machine.

One problem with finite state machines with a structure which utilizes a next state decode block, state memory storage elements and an output decode block is that the outputs to the finite state machine may glitch as the outputs from the state memory storage elements propagate through the output decoder. To eliminate this problem, some designers opt for an alternate architecture which eliminates the output decode logic. In this case, the structure includes only the next state decode block and memory storage elements. The memory storage elements include a dedicated flip-flop for each FSM output. This eliminates the need for the output decode block.

In one variation of finite state machines without output decode blocks there are storage elements for each individual FSM output and, in addition, storage elements which encode the state. In this case the values of the storage elements for the individual FSM outputs are not fed back into the next state decode block to determine the current state.

In another variation of finite state machines without output decode blocks, there are storage elements for each individual FSM output, but there is not storage elements which encode the state. This type of finite state machine may be referred to as an output encoded finite state machine. The state of the output encoded finite state machine is determined by the next state decode block using the value of the FSM outputs. If each state has a unique combination of the values of the FSM outputs, the next state decode block is able to determine the current state using only the FSM outputs. When more than one state has the same combination of the values of the FSM outputs, the next state decode block is no longer able to determine the current state using only the FSM outputs. Therefore, one or more additional storage elements are added and assigned values so that each state has a unique combination of the values stored by all the storage elements, that is a combination of the values of both the FSM outputs and the outputs of the additional storage elements.

SUMMARY OF THE INVENTION

In accordance with the preferred embodiment of the present invention, logic to determine the current state of an output encoded finite state machine is minimized. Specifically, in order to generate logic for a finite state machine, input is received from a user. The input specifies states of the finite state machine, transition conditions between states and output values for each state. For example, a graphical user interface is used to receive a graphic portrayal of a state diagram.

Logic is generated which implements the finite state machine from the inputs received by the interface means. Particularly, a plurality of flip-flops is generated. A first set of flip-flops is for storing output for the finite state machine. A second set of flip-flops is used, when necessary, with the first set of flip-flops to uniquely identify each state. When output values of the first set of flip-flops uniquely identify each state, the second set of flip-flops is not used (i.e., the second set of flip-flops is the null set). For each state, a combination of a minimum number of the flip-flops from the first set of flip-flops and the second set of flip-flops is detected which uniquely identifies the state.

For example, first, an output value for each flip-flop in the state is compared against the output value for the output flip-flop for every other state until a first output value for a first output flip-flop is found which uniquely identifies the state or until output values for all output flip-flops in the state have been checked without finding an output flip-flop which uniquely identifies the state. When all output values for all flip-flops in the state have been checked and no output value for any flip-flops uniquely identifies the state, every combination of two output values for two flip-flops in the state is compared against the output values for the two flip-flops for every other state until output values for a first pair of flip-flops is found which uniquely identifies the state or until output values for all pairs of flip-flops in the state have been checked without finding a pair of flip-flops which uniquely identifies the state. And so on.

The preferred embodiment of the present invention allows for the reduction of logic required for implementation of an output encoded state machine.

DESCRIPTION OF THE PREFERRED EMBODIMENT

The preferred embodiment of the present invention is implemented within an engineering tool which generates a finite state machine (FSM) using a graphical user interface (GUI).

Figure 1:
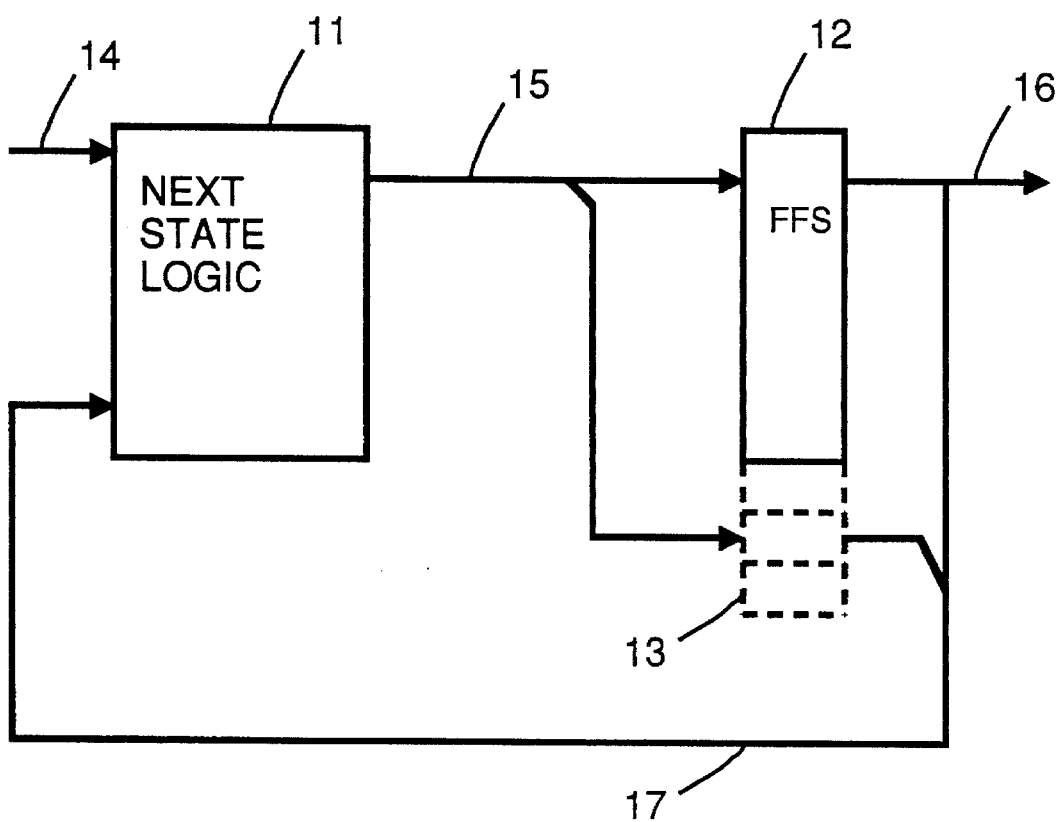
FIG. 1 shows a block diagram of an output encoded finite state machine.

For example, FIG. 1 shows a simplified block diagram of an output encoded finite state machine. Storage memory elements 12 include a series of delay (D) flip-flops, one D flip-flop for each of the FSM outputs 16. Additional storage memory elements 13 are additional D flip-flops which are added when needed to determine the current state of the finite state machine, as will be described further below.

A next state logic block 11 determines the next values 15 for storage elements 12 and storage elements 13 using inputs 14 and registered outputs 17, which are the current values held in storage elements 12 and storage elements 13. The current state of the finite state machine shown in FIG. 1 is determined by registered outputs 17. If each state has a unique combination of the values held in storage elements 12, storage elements 13 are eliminated from the finite storage elements. When more than one state has the same combination of the values held in storage elements 12, there are a sufficient number of storage elements within storage elements 13 so that each state has a unique combination of registered outputs 17.

Figure 2:
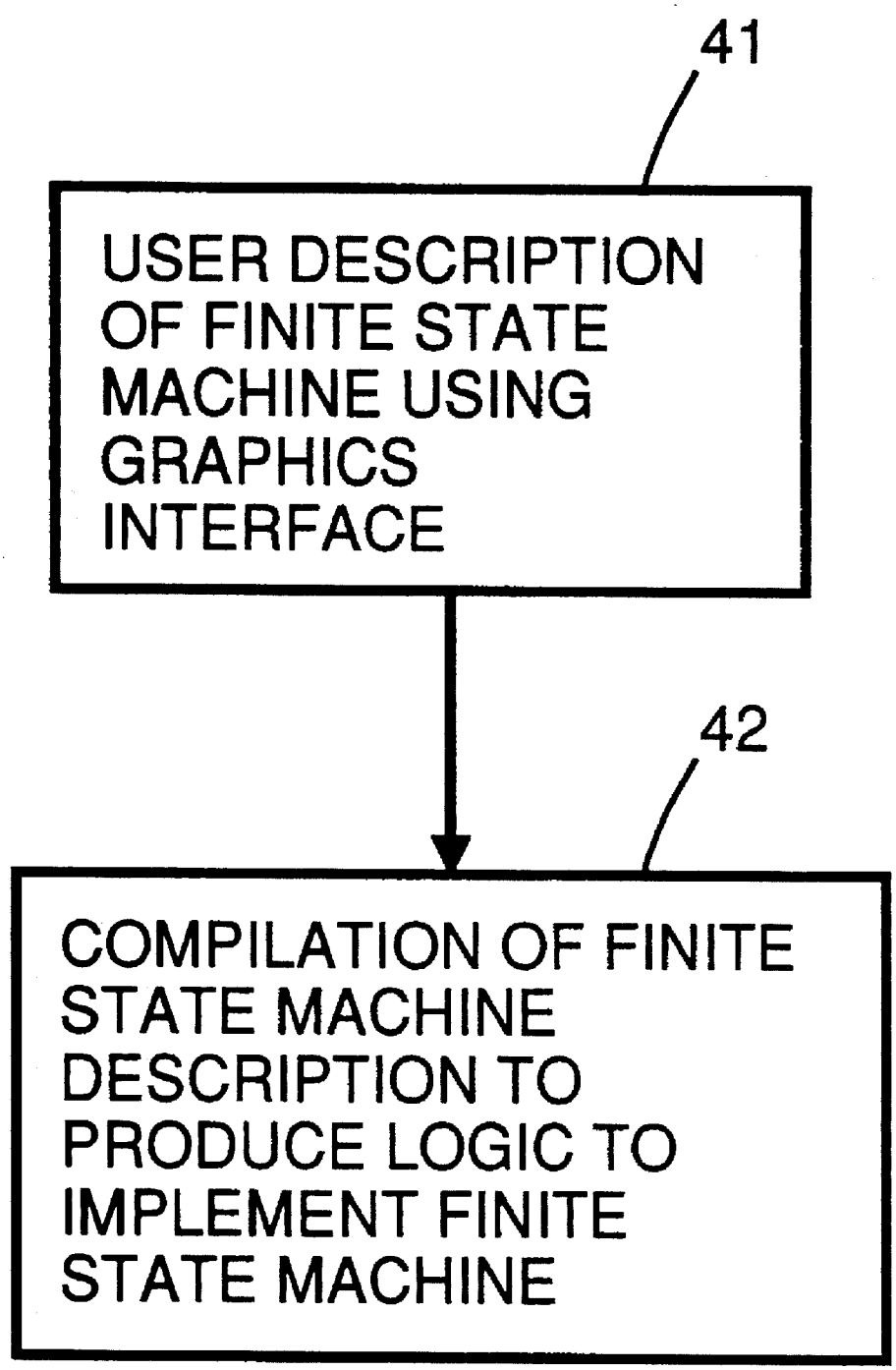
FIG. 2 is a simplified block diagram illustrating operation of a engineering tool used to produce an output encoded finite state machine in accordance with the preferred embodiment of the present invention.

FIG. 2 is a simplified block diagram illustrating operation of a engineering tool used to produce the output encoded finite state machine shown in FIG. 1. In a step 41, a user enters a user description of finite state machine using a graphical user interface. The finite state machine description includes a state diagram for the finite state machine. Each state of the finite state machine is given a name. Additionally, the state diagram includes a list of output values in each of the states. The state diagram also contains conditions to transition to other states.

In a step 42, the engineering tool compiles the finite state machine description entered by the user in step 41. The compilation produces logic which implements the finite state machine. For a general description of compilers which generate logic for finite state machines, see, for example, see, for example, Steve Golson, *State Machine Design Techniques for Verilog and VHDL*, Synopsys Journal of High-Level Design, September 1994, pp. 1–44. See also, *Design Compiler Family Reference Manual, Version 3.1A*, available from Synopsys Co., March 1994, pp. 10-1 through 10-38.

Figure 3:
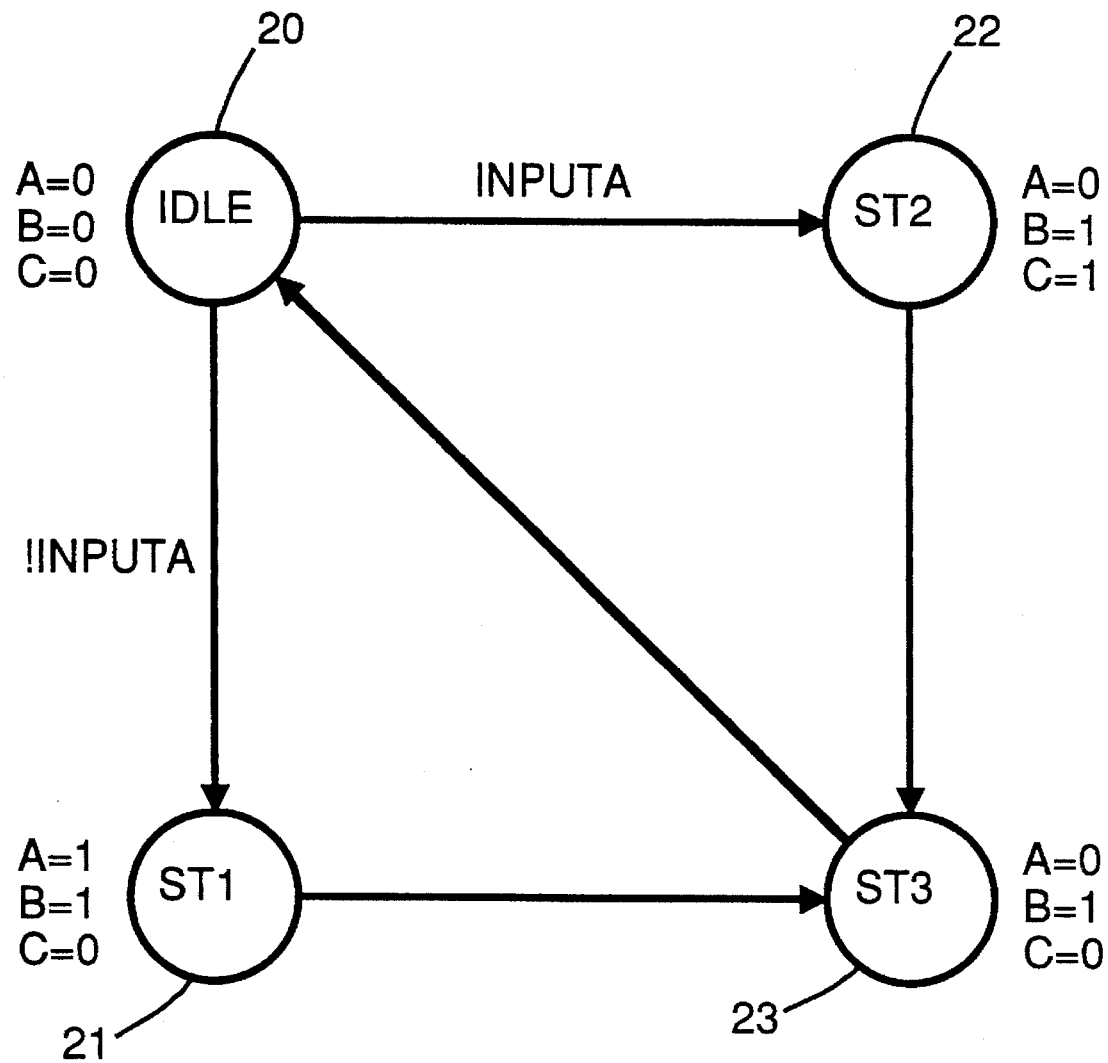
FIG. 3 shows a state diagram for a finite state machine in accordance with the preferred embodiment of the present invention.

FIG. 3 shows an example of a state diagram for a finite state machine entered by a user in step 41. The state diagram includes four FSM states, an idle state 20 (IDLE), a first state 21 (STATE 1), a second state 22 (STATE 2) and a third state 23 (STATE 3). In idle state 20, an output A has a value of 0, an output B has a value of 0, and an output C has a value of 0. In first state 21, output A has a value of 1, output B has a value of 1, and output C has a value of 0. In second state 22, output A has a value of 0, output B has a value of 1, and output C has a value of 1. In third state 23, output A has a value of 0, output B has a value of 1, and output C has a value of 0.

In idle state 20, when an input value INPUTA is asserted (i.e., at logic 1), on a next clock cycle, the finite state machine transitions to second state 22. In idle state 20, when input value INPUTA is de-asserted (i.e., at logic 0), on a next clock cycle, the finite state machine transitions to first state 21. In first state 21, on a next clock cycle, the finite state machine transitions to third state 23. In second state 22, on a next clock cycle, the finite state machine transitions to third state 23. In third state 23, on a next clock cycle, the finite state machine transitions to idle state 20.

In order to implement an output encoded finite state machine, for each state, the output values of storage elements 12 are analyzed and the maximum number of states with identical output values of storage elements 12 are counted. A sufficient number of flip-flops are included in additional storage memory elements 13 so that each state has a unique set of the registered outputs 17. If a large number of states have identical output values for storage elements 12, the number of flip-flops within storage memory elements 13 can approach the number needed for a binary encoded state machine.

Since each state has a unique set of registered outputs 17, it is possible to determine the current state from logic which utilizes all of registered outputs 17. For a discussion on resolving the value of unspecified registered outputs, see co-pending U.S. patent application Ser. No. 08/325,765 for MINIMIZING LOGIC BY RESOLVING "DON'T CARE" OUTPUT VALUES IN A FINITE STATE MACHINE, by Scott C. Petler, the subject matter of which is incorporated by reference.

In the preferred embodiment of the present invention, the number of registered outputs 17 used to recognize the current state of the finite state machine is minimized. This allows minimization of logic to implement next state logic 11.

Figure 4:
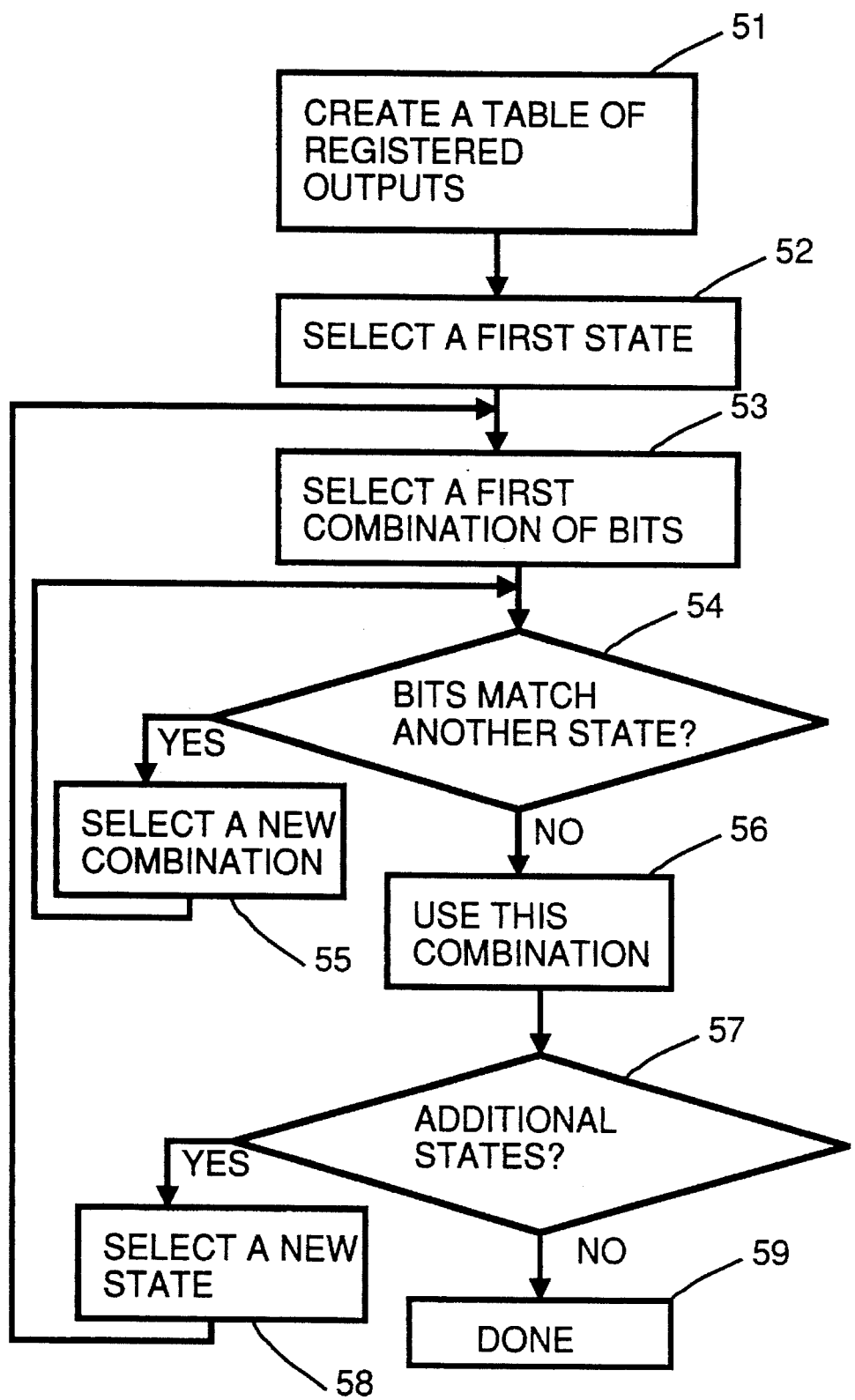
FIG. 4 shows a flow chart which describes design of logic which minimizes the number of flip-flops used to determine current state in an output encoded finite state machine in accordance with the preferred embodiment of the present invention.

FIG. 4 shows a flow chart which shows design of logic which uses a minimum of logic to recognize the current state of the output encoded finite state machine. In a step 51, a table of registered outputs is created for the output encoded state machine. In a step 52, a first state is selected. In a step 53 a first combination of output values are selected. That is a combination of one or more bits of registered outputs 17 are selected. Each output value is a one bit output from a flip-flop.

In the preferred embodiment, when selecting combinations of output values for a state, all the one bit combinations are selected first. When all the one bit combinations have been selected, then the two bit combinations are considered. When all the two bit combinations are considered, then the three bit combinations are considered. And so on. Thus, in substep 53, a one output value combination of registered outputs 17 is selected.

In a step 54, the combination of output values currently selected for the selected state are compared with corresponding output values for every other state. If there is a match, in a step 55, a new combination of registered outputs 17 is selected. As discussed above, in the preferred embodiment, when selecting combinations of output values for a state, all the one output value combinations are selected first. When all the one output value combinations have been selected, then the two output value combinations are considered. When all the two output value combinations are considered, then the three output value combinations are considered. And so on.

If in step 54, the comparison between the combination of registered outputs currently selected for the selected state and the corresponding output values for every other state does not result in a match, in a step 56, this combination of output values is selected to determine the current state.

In a step 56, a determination is made whether there are states for which a combination of output values has not been selected. If so, in a step 58, a new state is selected and the process continues. If not, in a step 59, the process is finished.

For example, consider the state diagram shown in FIG. 3. The table created in step 51 has, for example, the form of Table 1 below:

TABLE 1

| FSM State | Output Values | | |
|---|---|---|---|
|  | A | B | C |
| IDLE | 0 | 0 | 0 |
| STATE 1 | 1 | 1 | 0 |
| STATE 2 | 0 | 1 | 1 |
| STATE 3 | 0 | 1 | 0 |

In step 52, idle state 20 is selected. In step 53, a first combination of flip-flop output values is selected for idle state 20. The first combination of output values is output value C. This is represented by Table 2 below:

TABLE 2

| FSM State | Output Values | | |
|---|---|---|---|
|  | A | B | C |
| IDLE | X | X | 0 |

In Table 2, the "0" under output value C indicates the value of output value C for idle state 20. The "X" under output value A and output value B indicate that these output values are not used in the combination represented by Table 2.

In step 54, the combination set out in Table 2 is compared with output values for the three other states. In both first state 21 and third state 23, output value C is a "0". Therefore, there are two matches. Thus, in step 55, a new combination of output values for idle state 20 is chosen.

In step 53, a second combination of output values is selected for idle state 20. The second combination of output values is output value B. This is represented by Table 3 below:

TABLE 3

| FSM State | Output Values | | |
|---|---|---|---|
|  | A | B | C |
| IDLE | X | 0 | X |

In step 54, the combination set out in Table 3 is compared with output values for the three other states. In none of first state 21, second state 22 and third state 23 is output value B equal to "0". Therefore, there are no matches. Thus, in step 56, this combination (output value B equals 0) is used to identify idle state 20.

In step 57, it is determined that there are still additional states to be evaluated. Therefore, in step 58, first state 21 is selected. In step 53, a first combination of output values is selected for first state 21. The first combination of output values is output value C. This is represented by Table 4 below:

TABLE 4

| FSM State | Output Values | | |
|---|---|---|---|
|  | A | B | C |
| STATE 1 | X | X | 0 |

In step 54, the combination set out in Table 4 is compared with output values for the three other states. In both idle state 20 and third state 23, output value C is a "0". Therefore, there are two matches. Thus, in step 55, a new combination of output values for first state 21 is chosen.

In step 53, a second combination of output values is selected for first state 21. The second combination of output values is output value B. This is represented by Table 5 below:

TABLE 5

| FSM State | Output Values | | |
|---|---|---|---|
|  | A | B | C |
| STATE 1 | X | 1 | X |

In step 54, the combination set out in Table 5 is compared with output values for the three other states. In both second state 22 and third state 23, output value B is a "1". Therefore, there are two matches. Thus, in step 55, a new combination of output values for first state 21 is chosen.

In step 53, a third combination of output values is selected for first state 21. The third combination of output values is output value A. This is represented by Table 6 below:

TABLE 6

| FSM State | Output Values | | |
|---|---|---|---|
|  | A | B | C |
| STATE 1 | 1 | X | X |

In step 54, the combination set out in Table 6 is compared with output values for the three other states. In none of idle state 20, second state 22 and third state 23 is output value A equal to "1". Therefore, there are no matches. Thus, in step 56, this combination (output value A equals 1) is used to identify first state In step 57, it is determined that there are still additional states to be evaluated. Therefore, in step 58, second state 22 is selected. In step 53, a first combination of output values is selected for first state 21. The first combination of output values is output value C. This is represented by Table 7 below:

TABLE 7

| FSM State | Output Values | | |
|---|---|---|---|
|  | A | B | C |
| STATE 2 | X | X | 1 |

In step 54, the combination set out in Table 7 is compared with output values for the three other states. In none of idle state 20, first state 21 and third state 23 is output value C equal to "1". Therefore, there are no matches. Thus, in step 56, this combination (output value C equals 1) is used to identify second state 22.

In step 57, it is determined that there is still an additional state to be evaluated. Therefore, in step 58, third state 23 is selected. In step 53, a first combination of output values is selected for third state 23. The first combination of output values is output value C. This is represented by Table 8 below:

TABLE 8

| FSM State | Output Values | | |
|---|---|---|---|
| | A | B | C |
| STATE 3 | X | X | 0 |

In step 54, the combination set out in Table 8 is compared with output values for the three other states. In both idle state 20 and first state 21, output value C is a "0". Therefore, there are two matches. Thus, in step 55, a new combination of output values for third state 23 is chosen.

In step 53, a second combination of output values is selected for third state 23. The second combination of output values is output value B. This is represented by Table 9 below:

TABLE 9

| FSM State | Output Values | | |
|---|---|---|---|
| | A | B | C |
| STATE 3 | X | 1 | X |

In step 54, the combination set out in Table 9 is compared with output values for the three other states. In both first state 21 and second state 22, output value B is a "1". Therefore, there are two matches. Thus, in step 55, a new combination of output values for third state 23 is chosen.

In step 53, a third combination of output values is selected for third state 23. The third combination of output values is output value A. This is represented by Table 10 below:

TABLE 10

| FSM State | Output Values | | |
|---|---|---|---|
| | A | B | C |
| STATE 3 | 0 | X | X |

In step 54, the combination set out in Table 10 is compared with output values for the three other states. In both idle state 20 and second state 22, output value A is a "0". Therefore, there are two matches. Thus, in step 55, a new combination of output values for third state 23 is chosen.

In step 53, a fourth combination of output values is selected for third state 23. Since all the one output value combinations have been checked, a two output value combination is selected. The fourth combination of output values is output value C and output value B. This is represented by Table 11 below:

TABLE 11

| FSM State | Output Values | | |
|---|---|---|---|
| | A | B | C |
| STATE 3 | X | 1 | 0 |

In step 54, the combination set out in Table 11 is compared with output values for the three other states. In first state 21, output value B is a "1" and output value "C" is 0. Therefore, there is a match. Thus, in step 55, a new combination of output values for third state 23 is chosen.

In step 53, a fifth combination of output values is selected for third state 23. The fifth combination of output values is output value C and output value A. This is represented by Table 12 below:

TABLE 12

| FSM State | Output Values | | |
|---|---|---|---|
| | A | B | C |
| STATE 3 | 0 | X | 0 |

In step 54, the combination set out in Table 12 is compared with output values for the three other states. In idle state 20, output value A is a "0" and output value "C" is 0. Therefore, there is a match. Thus, in step 55, a new combination of output values for third state 23 is chosen.

In step 53, a sixth combination of output values is selected for third state 23. The sixth combination of output values is output value B and output value A. This is represented by Table 13 below:

TABLE 13

| FSM State | Output Values | | |
|---|---|---|---|
| | A | B | C |
| STATE 3 | 0 | 1 | X |

In step 54, the combination set out in Table 13 is compared with output values for the three other states. In second state 22, output value A is a "0" and output value "B" is 1. Therefore, there is a match. Thus, in step 55, a new combination of output values for third state 23 is chosen.

In step 53, a seventh combination of output values is selected for third state 23. Since all the two output value combinations have been checked, a three output value combination is selected. The seventh combination of output values is output value C, output value B and output value A. This is represented by Table 14 below:

TABLE 14

| FSM State | Output Values | | |
|---|---|---|---|
| | A | B | C |
| STATE 3 | 0 | 1 | 0 |

In step 54, the combination set out in Table 14 is compared with output values for the three other states. In none of idle state 20, first state 21 and second state 22 is there a match for this combination. Therefore, in step 56, this combination (output value A equals 0, output value B equals 1 and output value C equals 0) is used to identify third state 23.

The final state recognition table for recognizing the various states is set out in table 15 below:

TABLE 15

| FSM State | Output Values | | |
|---|---|---|---|
| | A | B | C |
| IDLE | X | 0 | X |
| STATE 1 | 1 | X | X |
| STATE 2 | X | X | 1 |
| STATE 3 | 0 | 1 | 0 |

The contents of Table 15 can be used in hardware design language (HDL) representation for synthesis using a construction such as the construct for "casex" in Verilog given in Table 16 below:

TABLE 16

| casex(curr_state) | | |
|---|---|---|
| IDLE | : | 3'bx0x |
| ST1 | : | 3'b1xx |
| ST2 | : | 3'bxx1 |
| ST3 | : | 3'b010 |
| endcase | | |

For an actual implementation of the state machine, the present invention can result in a significant reduction in logic to implement next state logic 11.

Figure 5:
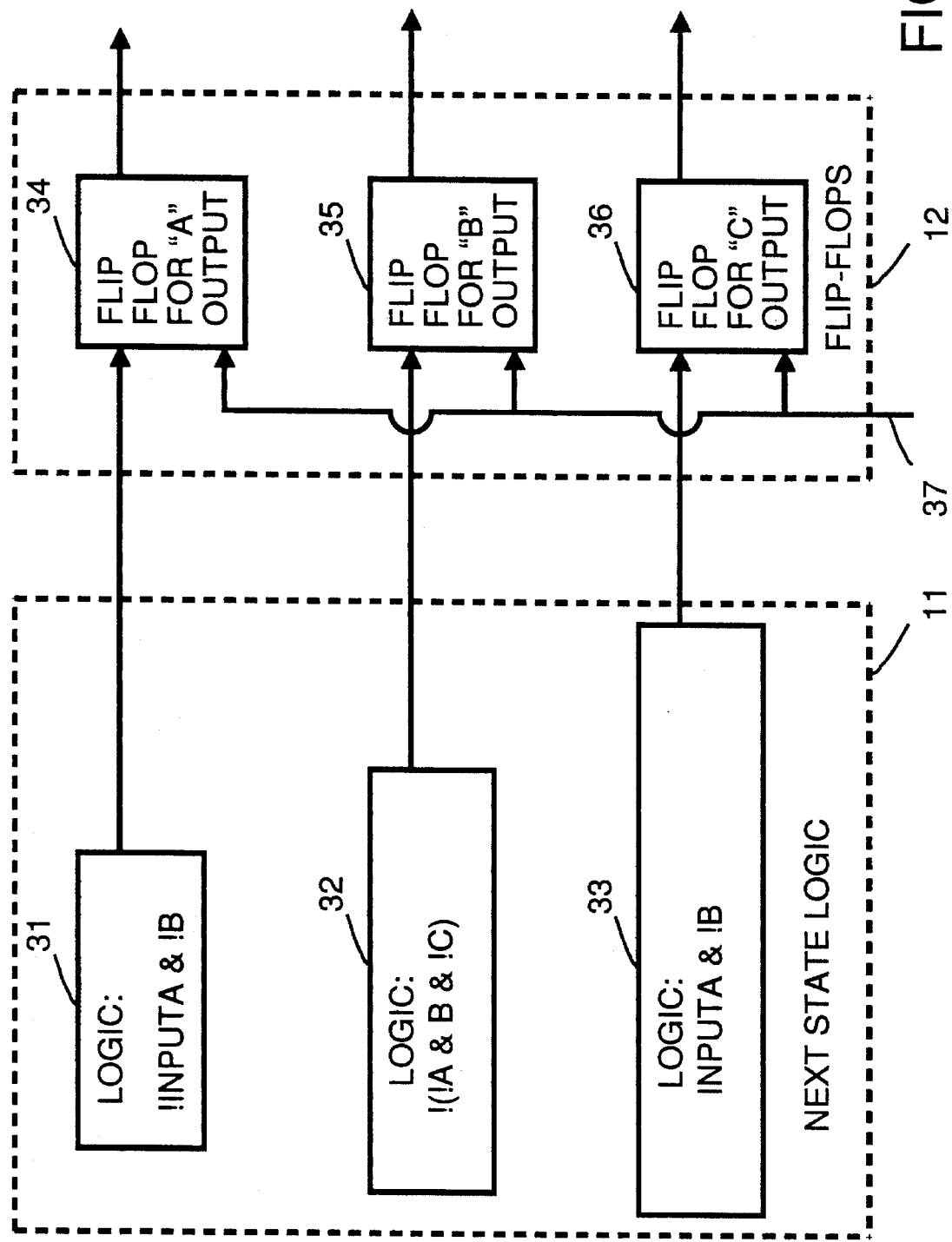
FIG. 5 shows a simplified block diagram of a finite state machine generated from the state diagram shown in FIG. 3 using the methodology described in the flow chart shown in FIG. 4 in accordance with the preferred embodiment of the present invention.

For example, FIG. 5 shows a implementation of a finite state machine. Storage memory elements 12 includes a D flip-flop 34 for the A output, a D flip-flop 35 for the B output and a D flip-flop 36 for the C output. A clock line 37 is also shown. There is no need for additional storage elements 13.

Next state logic 11 includes logic 31 to generate an input to D flip-flop 34, logic 32 to generate an input to D flip-flop 35 and logic 33 to generate an input to D flip-flop 36. From the state diagram in FIG. 3, it is seen that input A is asserted (i.e., at a value of logic 1) only in first state 21. Thus, logic 31 may be implemented by the following logic statement:

NOT INPUTA AND IDLE.

By substituting the combination for IDLE given by Table 15, it is seen that logic 31 may be implemented by the following logic, as shown in FIG. 3:

NOT INPUTA AND NOT B

Likewise, from the state diagram shown in FIG. 3, it is seen that input B is de-asserted (i.e., at logic 0) only in idle state 20. Thus, logic 32 may be implemented by the following logic statement:

NOT STATE 3.

By substituting the combination for STATE 3 given by Table 15, it is seen that logic 32 may be implemented by the following logic, as shown in FIG. 3:

NOT (NOT A AND B AND NOT C)

Also from the state diagram in FIG. 3, it is seen that input C is asserted (i.e., at a value of logic 1) only in second state 22. Thus, logic 33 may be implemented by the following logic statement:

INPUTA AND IDLE.

By substituting the combination for IDLE given by Table 15, it is seen that logic 33 may be implemented by the following logic, as shown in FIG. 3:

INPUTA AND NOT B

Further reduction or optimization of logic 31, logic 32 and logic 33 may be performed using Boolean transformations.

In the example given above, the output encoded finite state machine was implemented without use of additional storage elements 13. As will be understood, the same methodology is used when additional storage elements are required.

Figure 6:
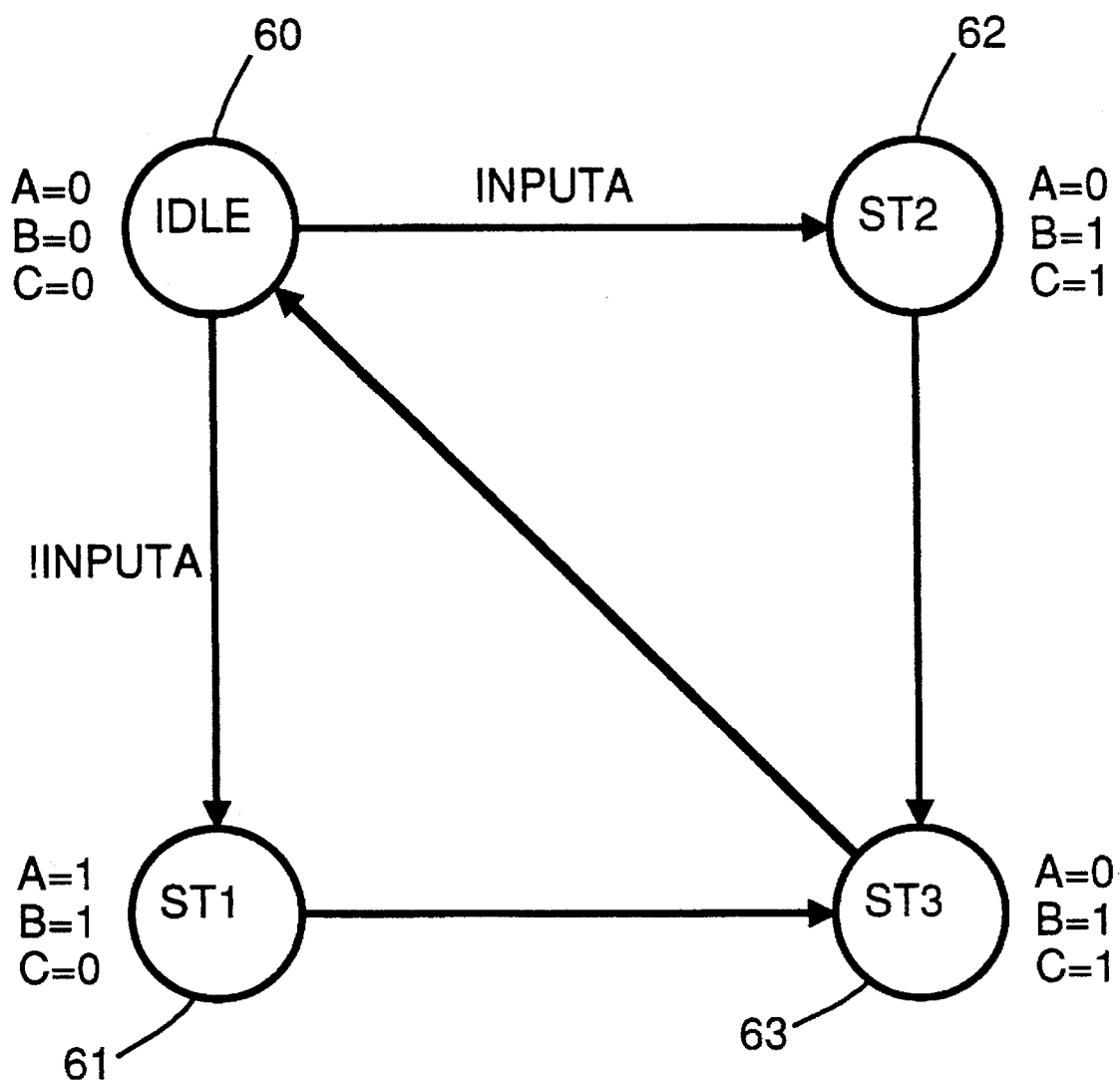
FIG. 6 shows a second state diagram for a finite state machine in accordance with the preferred embodiment of the present invention.

For example, FIG. 6 shows an example of a state diagram for a finite state machine entered by a user in step 41. The state diagram includes four FSM states, an idle state 60, a first state 61, a second state 62 and a third state 63. In idle state 60, an output A has a value of 0, an output B has a value of 0, and an output C has a value of 0. In first state 61, output A has a value of 1, output B has a value of 1, and output C has a value of 0. In second state 62, output A has a value of 0, output B has a value of 1, and output C has a value of 1. In third state 63, output A has a value of 0, output B has a value of 1, and output C has a value of 1.

In idle state 60, when an input value INPUTA is asserted, on a next clock cycle, the finite state machine transitions to second state 62. In idle state 60, when input value INPUTA is de-asserted, on a next clock cycle, the finite state machine transitions to first state 61. In first state 61, on a next clock cycle, the finite state machine transitions to third state 63. In second state 62, on a next clock cycle, the finite state machine transitions to third state 63. In third state 63, on a next clock cycle, the finite state machine transitions to idle state 60.

In order to implement an output encoded finite state machine, for each state, the output values of storage elements 12 are analyzed and the maximum number of states with identical output values of storage elements 12 are counted. A sufficient number of flip-flops are included in additional storage memory elements 13 so that each state has a unique set of the registered outputs 17.

Since second state 62 and third state 63 have identical output values A, B and C, it will be impossible to determine the current state from logic which utilizes only output values from the flip-flops in storage elements 12. Therefore, a flip-flop Q0 is included within storage elements 13.

For this example the table created in step 51 has, for example, the form of Table 17 below:

TABLE 17

| FSM State | Q0 | A | B | C |
|---|---|---|---|---|
| IDLE | 0 | 0 | 0 | 0 |
| STATE 1 | 0 | 1 | 1 | 0 |
| STATE 2 | 0 | 0 | 1 | 1 |
| STATE 3 | 1 | 0 | 1 | 1 |

Using the methodology set out in FIG. 4 results, when applied as described above, in the final state recognition combinations for recognizing the various states as set out in table 18 below:

TABLE 18

| | Output Values | | | |
|---|---|---|---|---|
| FSM State | Q0 | A | B | C |
| IDLE | X | X | 0 | X |
| STATE 1 | X | 1 | X | X |
| STATE 2 | 0 | X | X | 1 |
| STATE 3 | 1 | X | X | X |

The contents of Table 18 can be used in hardware design language (HDL) representation for synthesis using a construction such as the construct for "casex" in Verilog given in Table 19 below:

TABLE 19

| casex(curr_state) | | |
|---|---|---|
| IDLE | : | 4'bxx0x |
| ST1 | : | 4'bx1xx |
| ST2 | : | 4'b0xx1 |
| ST3 | : | 4'b1xxx |
| endcase | | |

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for generating logic for a finite state machine, comprising the steps of:

(a) receiving, from a user, input which specifies states of the finite state machine, which specifies transition conditions between states and which specifies output values for each state; and, (b) generating logic which implements the finite state machine from the input received in step (a), including the following substeps:

(b.1) generating a plurality of flip-flops, a first set of flip-flops being for storing the output values for the finite state machine, and a second set of flip-flops being used with the first set of flip-flops to uniquely identify each state wherein each flip-flop from the first set of flip-flops stores a single output value, (b.2) when output values of the first set of flip-flops uniquely identify each state, making the second set of flip-flops a null set, and (b.3) determining for each state a combination of a minimum number of the flip-flops from the first set of flip-flops and the second set of flip-flops which uniquely identifies the state.

2. A method as in claim 1 wherein substep (b.3) includes performing the following substeps for each state:

(b.3.1) comparing an output value for each flip-flop in the state against the output value for the output flip-flop for every other state until a first output value for a first output flip-flop is found which uniquely identifies the state or until output values for all output flip-flops in the state have been checked without finding an output flip-flop which uniquely identifies the state; and, (b.3.2) when all output values for all flip-flops in the state have been checked and no output value for any flip-flops uniquely identifies the state, comparing every combination of two output values for two flip-flops in the state against the output values for the two flip-flops for every other state until output values for a first pair of flip-flops is found which uniquely identifies the state or until output values for all pairs of flip-flops in the state have been checked without finding a pair of flip-flops which uniquely identifies the state.

3. A method as in claim 1 wherein step (a) includes using a graphical user interface to receive the input, the input including a graphic portrayal of a state diagram.

4. An engineering tool for generating logic for a finite state machine, comprising:

interface means for receiving, from a user, input which specifies states of the finite state machine, which specifies transition conditions between states and which specifies output values for each state; and, generating means, coupled to the interface means, for generating logic which implements the finite state machine from the inputs received by the interface means, the logic including a plurality of flip-flops, a first set of flip-flops being for storing the output values for the finite state machine, and a second set of flip-flops being used with the first set of flip-flops to uniquely identify each state, the second set of flip-flops being a null set when output values of the first set of flip-flops uniquely identify each state, wherein the generating means determines for each state a combination of a minimum number of the flip-flops from the first set of flip-flops and the second set of flip-flops which uniquely identify the state wherein each flip-flop from the first set of flip-flops stores a single output value.

5. An engineering tool as in claim 4 wherein the generating means includes means for comparing an output value for each flip-flop in the state against the output value for the output flip-flop for every other state until a first output value for a first output flip-flop is found which uniquely identifies the state or until output values for all output flip-flops in the state have been checked without finding an output flip-flop which uniquely identifies the state, and when all output values for all flip-flops in the state have been checked and no output value for any flip-flops uniquely identifies the state, comparing every combination of two output values for two flip-flops in the state against the output values for the two flip-flops for every other state until output values for a first pair of flip-flops is found which uniquely identifies the state or until output values for all pairs of flip-flops in the state have been checked without finding a pair of flip-flops which uniquely identifies the state.

6. An engineering tool as in claim 4 wherein the interface means comprises a graphical user interface, and wherein the user input which specifies states of the finite state machine, transition conditions between states and output values for each state is in the form of a state diagram.

7. A method for generating logic for a finite state machine, the method comprising the steps of:

(a) receiving, from a user, input which specifies states of the finite state machine, which specifies transition conditions between states and which specifies finite state machine output values for each state; and, (b) generating logic for a finite state machine from the inputs received in step (a) including, for each output of the finite state machine, generating an output flip-flop which stores the output, the generating of the logic including the following substeps, (b.1) if all states cannot be uniquely identified by current values stored by the output flip-flops, adding additional flip-flops and assigning values to the additional flip-flops for each state so that each state can be uniquely identified by current values stored by the output flip-flops and the additional flip-flops, and (b.2) for each state performing the following substeps, (b.2.1) when in substep (b.1) it was determined all states can be uniquely identified by current values stored by the output flip-flops, determining for each state a combination of a minimum number of the output flip-flops which uniquely identifies the state, and (b.2.2) when in substep (b.1) it was determined all states cannot be uniquely identified by current values stored by the output flip-flops, determining for each state a combination of a minimum number of the output flip-flops and the additional flip-flops which uniquely identifies the state.

8. A method as in claim 7 wherein substep (b.2.1) includes, performing, for each state, the following substeps:

(b.2.1.1) comparing an output value for each output flip-flop in the state against the output value for the output flip-flop for every other state until a first output value for a first output flip-flop is found which uniquely identifies the state or until output values for all output flip-flops in the state have been checked without finding an output flip-flop which uniquely identifies the state; and, (b.2.1.2) when in substep (b.2.1.1) all output values for all output flip-flops in the state have been checked and no output value for any output flip-flops uniquely identifies the state, comparing every combination of two output values for two output flip-flops in the state against the output values for the two output flip-flops for every other state until output values for a first pair of output flip-flops is found which uniquely identifies the state or until output values for all pairs of output flip-flops in the state have been checked without finding a pair of output flip-flops which uniquely identifies the state.

9. A method as in claim 8 wherein substep (b.2.2) includes, performing the following substeps:

(b.2.2.1) comparing an output value for each output/additional flip-flop in the state against the output value for the output/additional flip-flop for every other state until a first output value for a first output/additional flip-flop is found which uniquely identifies the state or until output values for all output/additional flip-flops in the state have been checked without finding an output/additional flip-flop which uniquely identifies the state; and, (b.2.2.2) when in substep (b.2.1.1) all output values for all output/additional flip-flops in the state have been checked and no output value for any output/additional flip-flops uniquely identifies the state, comparing every combination of two output values for two output/additional flip-flops in the state against the output values for the two output/additional flip-flops for every other state until output values for a first pair of output/additional flip-flops is found which uniquely identifies the state or until output values for all pairs of output/additional flip-flops in the state have been checked without finding a pair of output/additional flip-flops which uniquely identifies the state.

10. A method as in claim 7 wherein step (a) includes using a graphical user interface to receive the input, the input including a graphic portrayal of a state diagram.

* * * * *